(12) United States Patent
Moriceau et al.

(10) Patent No.: US 8,481,409 B2
(45) Date of Patent: *Jul. 9, 2013

(54) MANUFACTURING PROCESS FOR A STACKED STRUCTURE COMPRISING A THIN LAYER BONDING TO A TARGET SUBSTRATE

(75) Inventors: Hubert Moriceau, St. Egreve (FR); Bernard Aspar, Rives (FR); Eric Jalaguier, Saint Martin d'Uriage (FR); Fabrice Letertre, Grenoble (FR)

(73) Assignee: Commissariat a l'Energie Atomique (FR)

( * ) Notice: Subject to any disclaimer, the term of this patent is extended or adjusted under 35 U.S.C. 154(b) by 743 days.

This patent is subject to a terminal disclaimer.

(21) Appl. No.: 11/233,785

(22) Filed: Sep. 23, 2005

(65) Prior Publication Data

US 2006/0079071 A1    Apr. 13, 2006

Related U.S. Application Data

(63) Continuation of application No. 10/415,672, filed on Apr. 30, 2003, now Pat. No. 6,974,759.

(30) Foreign Application Priority Data

Nov. 6, 2000 (FR) .................................. 00 14170

(51) Int. Cl.
*H01L 21/30* (2006.01)

(52) U.S. Cl.
USPC ............. 438/459; 257/E21.568; 257/E21.569

(58) Field of Classification Search
CPC ................................................ H01L 21/76254
USPC ........................ 438/459–465, 106–113, 977
See application file for complete search history.

(56) References Cited

U.S. PATENT DOCUMENTS

| 5,391,257 A | 2/1995 | Sullivan et al. ............... 156/630 |
| 5,863,830 A | 1/1999 | Bruel et al. .................... 438/478 |

(Continued)

FOREIGN PATENT DOCUMENTS

| EP | 0 536 788 | 4/1993 |
| FR | 2781082 | 7/1998 |

(Continued)

OTHER PUBLICATIONS

Endo et al., "Novel LSI/SOI Wafer Fabrication Using Device Layer Transfer Technique", NEC Corporation, 1985 International, U.S.A., IEEE, 1985, vol. 31, 688-691.

(Continued)

*Primary Examiner* — Savitr Mulpuri
(74) *Attorney, Agent, or Firm* — Hayes Soloway P.C.

(57) ABSTRACT

The invention relates to a process for manufacturing a stacked structure comprising at least one thin layer bonding to a target substrate, comprising the following steps:
  a) formation of a thin layer starting from an initial substrate, the thin layer having a free face called the first contact face,
  b) putting the first contact face into bonding contact with a face of an intermediate support, the structure obtained being compatible with later thinning of the initial substrate,
  c) thinning of the said initial substrate to expose a free face of the thin layer called the second contact face and opposite the first contact face,
  d) putting a face of the target substrate into bonding contact with at least part of the second contact face, the structure obtained being compatible with later removal of all or some of the intermediate support,
  e) removal of at least part of the intermediate support in order to obtain the said stacked structure.

15 Claims, 2 Drawing Sheets

U.S. PATENT DOCUMENTS

| | | | |
|---|---|---|---|
| 5,993,677 A * | 11/1999 | Biasse et al. | 216/36 |
| 6,074,892 A | 6/2000 | Bowers et al. | 438/57 |
| 6,150,239 A | 11/2000 | Goesele et al. | 438/458 |
| 6,210,479 B1 | 4/2001 | Bojarczuk et al. | 117/84 |
| 6,225,192 B1 | 5/2001 | Aspar et al. | 438/460 |
| 6,326,279 B1 | 12/2001 | Kakizaki et al. | 438/406 |
| 6,355,541 B1 | 3/2002 | Holland et al. | 438/459 |
| 6,365,429 B1 * | 4/2002 | Kneissl et al. | 438/46 |
| 6,391,799 B1 | 5/2002 | Di Cioccio | 438/781 |
| 6,521,511 B1 | 2/2003 | Inoue et al. | 438/458 |
| 6,809,009 B2 | 10/2004 | Aspar et al. | 438/459 |
| 7,141,834 B2 * | 11/2006 | Atwater et al. | 257/184 |
| 2002/0094668 A1 | 7/2002 | Aspar et al. | 438/526 |
| 2004/0110316 A1 | 6/2004 | Ogihara et al. | 438/26 |

FOREIGN PATENT DOCUMENTS

| | | |
|---|---|---|
| JP | 5-102445 | 4/1993 |
| JP | 8-97389 | 4/1996 |
| JP | 8-186166 | 7/1996 |
| JP | 9-213594 | 8/1997 |
| JP | 11-26733 | 1/1999 |
| JP | 2000-252224 | 9/2000 |
| WO | WO0019499 | 4/2000 |

OTHER PUBLICATIONS

"Novel LSI/SOI Wafer Fabrication Using Device Layer Transfer Technique" Endo et al, XP002037723, 28.5, 698—IEDM Jan. 12, 1985, pp. 688-691.

"Effects of Electron Tunneling into a Single-Crystalline Si Layer Through an Ultrathin Buried Oxide" Ishikawa et al., XP000823131, 182, J.Jounal of Applied Physics p.d 09-1998.

* cited by examiner

MANUFACTURING PROCESS FOR A STACKED STRUCTURE COMPRISING A THIN LAYER BONDING TO A TARGET SUBSTRATE

CROSS-REFERENCE TO RELATED APPLICATION

This Application is a continuation of U.S. application Ser. No. 10/415,672, filed Apr. 30, 2003 now U.S. Pat. No. 6,974,759.

TECHNICAL FIELD

This invention relates to a process for manufacturing a stacked structure comprising a thin layer bonding to a target substrate. The invention is particularly applicable to the field of semiconductors.

STATE OF PRIOR ART

Document FR-A-2 681 472 (corresponding to U.S. Pat. No. 5,374,564) discloses a process for manufacturing thin films made of a semiconducting material. This document divulges that implantation of a rare gas and/or hydrogen in a substrate made of a semiconducting material could create a weakened layer that could contain micro-cavities or micro-bubbles (or platelets) at a depth approximately equal to the average penetration depth of the implanted ions. The implanted face of this substrate is brought into intimate contact with a support acting as a stiffener. Furthermore, heat treatment can be applied at a sufficiently high temperature to induce an interaction (or coalescence) between the micro-cavities or micro-bubbles causing a separation or fracture of the semiconducting substrate into two parts, namely a thin semiconducting film bonding to the stiffener, and secondly the rest of the semiconducting substrate that may in its turn be recycled as a donating substrate or a support. The separation takes place at the location at which the micro-cavities or micro-bubbles are present, in other words along the micro-cavities layer. The heat treatment is such that the interaction between the micro-bubbles or the micro-cavities created by implantation causes a separation between the thin film and the rest of the substrate. Therefore, there is a transfer of a thin film from an initial substrate as far as a stiffener that acts as a support for this thin film.

Ionic implantation refers to any means of introducing previously defined compounds alone or in combination. Some examples are ionic bombardment, diffusion, etc.

This process may also be applied to the manufacture of a thin film made of solid material other than a semiconducting material (a conducting or dielectric material) that may or may not be crystalline. This film may be single layer of multi-layer (for example see document FR-A-2 748 850).

This process can be used to make platelets, for example electronic quality SOI wafers, at an attractive cost, by transferring a silicon film onto a silicon substrate covered by an oxide layer.

The article "A new characterization process used to qualify SOI films" by H. MORICEAU et al published in E.C.S. Proc. Vol. 99-3, p. 173, discloses that an SOI wafer made according to this type of process can be bonded onto an oxidized silicon substrate. The result after the silicon substrate has been removed from the SOI wafer and from its oxide layer by means of a selective chemical attack (for example based on HF) is another SOI wafer with an inverted silicon film since the free face of this film is the face that was bonded to the buried oxide layer of the initial SOI wafer. This procedure was used because it was possible to examine defects in the silicon film. The purpose of this study was to identify the position of defects within the film thickness, rather than to make a new structure.

The articles entitled "Evaluation of defects in surface Si near Si/BOX interface in SIMOX platelets" by M. SUDOU et al. published in E.C.S. Proc. Vol. 97-23, p. 119 and "SIMOX technology and applications to wafer bonding" by A. J. AUBERTON-HERVE et al. published in E.C.S. Proc. Vol. 95-7, p. 12 disclose experiments with bonding an SOI wafer obtained using the SIMOX process directly on a silicon substrate or pure silica substrate. This process comprises a single bonding step and is followed by removal of the substrate from the SOI wafer. The purpose of these experiments was also to examine defects in the silicon film. A similar approach was used in the article entitled "Ultra thin silicon films directly bonded onto silicon wafers" by F. FOURNEL et al., published in Materials Science and Engineering, B 73 (2000), pages 42 to 46 to make a dislocation network in an interface plane defined when a thin film and a monocrystalline silicon substrate are put into contact. The article does not provide any information about the means of obtaining the thin layer in the stacked structure as described by the invention.

Document FR-A-2 725 074 (corresponding to U.S. Pat. No. 5,863,830) discloses a process for manufacturing a structure comprising a thin semiconducting film bonding to a target substrate. Initially, the thin film is bonded to an initial substrate by a first bonding energy. The thin film is then transferred from the initial substrate to the target substrate by applying tear off forces to overcome the first bonding energy and bonding of the thin film on the target substrate. This thin film may be transferred by means of an intermediate or manipulator substrate that in turn is separated from the thin film by tearing off. This process requires that the bonding energies at the different bonding interfaces associated with the thin film must be well controlled to enable successive tearing off.

The technique known as BESOI does not use separation of a thin film by implantation of gaseous compounds. One of its main characteristics is to use a crystalline stop layer to enable chemical (selective) attack while supporting a monocrystalline layer, typically made of silicon. This stop layer is a monocrystalline layer or an epitaxied layer. It may be a doped silicon layer, a layer obtained by epitaxy of crystalline material with a nature different from the nature of the thin film (for example $Si_xGe_{1-x}$), a monocrystalline layer of silicon made porous formed from the solid part of the silicon substrate. This technique cannot make use of an amorphous stop layer if it is required to deposit a monocrystalline film on this stop layer. It does not provide any information about the use of an intermediate substrate.

With the known process for making thin layers of structures, called the direct process and described in FR-A-2 681 472 and based on hydrogen implantation, molecular bonding with a final support and separation in and/or close to the implanted area, it is difficult to obtain some structures with specific properties, and/or these structures cannot be obtained with a sufficient quality. In the following cases, the direct process cannot be easily applied and the technical solution to be provided as described in this invention is not simply an adaptation of the process.

A first case relates to the manufacture of structures of thin and/or very thin stacked films with a crystalline layer present on the surface of an amorphous layer. A first example is the manufacture of films with thicknesses less than a few tens of nanometers, for example 20 nm thick silicon films on 20 nm thick $SiO_2$ films bonding to a solid silicon support. Bonding defects are then frequently revealed during the separation step in the direct process, which can be demonstrated when the process uses a separation step involving a low temperature heat treatment (for example less than 500° C.); this separation step may or may not be mechanically assisted. A second example is the case in which thin film structures with specific properties are subjected to heat treatments at temperatures greater than the temperatures of heat treatments applied previously during or after thinning of one of the substrates used (for example using thinning by the direct process). Bonding defects, for example such as bubbles inflated with gas, can then occur to the detriment of the quality of the structure.

A second case relates to the manufacture of structures in which bonding forces before the separation step using the direct process are very low. For example, for some surface preparation conditions before putting into contact (cleaning, level of the component manufacturing process that generates a given surface roughness), the bond between the final support and the generating plate of the film to be transferred has a very low energy. The separation step in the direct process is then impossible.

A third case relates to the manufacture of stacked structures of materials for which the coefficients of thermal expansion are too different. If the difference between the coefficients of thermal expansion of the material from which the film to be transferred is made, and the material of the final support is too high, the bond will fail before separation by the direct process if a heat treatment is applied to the bond. For example, this is the case for silicon and sapphire, for which the ratio between the coefficients of thermal expansion is 2.

A fourth case relates to the manufacture of structures in which bonding forces after the separation step using the direct process must be low or very low. It may be desirable for the bonding energy of the stacked structure to remain low after the separation step using the direct process, possibly even lower than the force necessary for separation, such that separation will be possible at the bonding interface later. This is applicable particularly when several treatments can reinforce the bonding interface. In a first example that for example corresponds to a removable target substrate so that it can be reused, thinning by sacrificial oxidation of a silicon surface film of an SOI structure at 950° C. causes an increase in the bonding energy greater than 1 $J/m^2$ which is not conducive to subsequent separation of the stacked structure of the target substrate. In a second example, thermal diffusion of compounds, local oxidation, etc., may be necessary to treat all or some of the layers, which is not a positive point for separation of the stacked structure since these operations participate in reinforcing the bonding energy. It may also be desirable to have a very low bonding energy in the final structure, for example in the case in which it is required to make a deposit on the structure, this deposit being highly stressed compared with all or some of the stacked structure and the target substrate. This weak interface then acts as a stress accommodation area. This is a support compliance application.

A fifth case relates to the manufacture of stacked structures made of heterogeneous materials. The use of materials with different natures, for example silicon or thermal oxide (various dielectrics, metallic materials, semiconductors, superconductors, etc.) may cause bonding defects demonstrated in the direct process. For example, the bonding of a silicon film covered by a silicon nitride film, with a silicon nitride film itself covering a silicon film, frequently introduces bonding defects that are easily demonstrated during the separation step in the direct process. In this case, a film is a substrate or a film or a stacked structure covered on the surface by the mentioned film.

A sixth case applies to the manufacture of stacked structures in which a phase change or a change in the nature of a material may occur. For example, some materials cannot be used in direct process due to incompatibility with the thermal budgets. Thus a stacked structure composed of a silicon film, a palladium film and a silicon wafer produces a silicide above 200° C. that can give a good bond. The bond degrades at higher temperatures, for example above 900° C. which is the temperature typically used to oxide a silicon film in order to reduce its thickness. Another example applies to optical applications in which a metallic mirror may be added to a silicon sheet by molecular bonding. This metallic mirror cannot be heat treated at temperatures above a few tens of ° C., so that thermal budgets that could be used in the separation process would be impossible.

The direct process cannot always be used to make stacked film structures including the conservation of a specific surface, called the front face.

In this respect, note as a first example the manufacture of stacked structures in which it is difficult to polish the surface film obtained. For example, the surface roughness of the structure thinned by the direct process after the separation step will need to be reduced depending on the planned application. In the case of silicon, this reduction in the roughness may conventionally be obtained by chemical-mechanical polishing (CMP). For many materials, for example "hard" materials, this polishing is either not suitable (ineffective) or takes too long (higher industrial cost). This is the case of a structure thinned using the direct process terminated at the surface using a sapphire, SiC or diamond film, for example. The surface micro-roughness of the "hard" film has to be reduced to satisfy the required application. For this type of material, polishing by CMP takes a very long time to implement and the uniformity of polishing on the structure is very difficult to control. The extra cost involved is then very high if an epi-ready type quality is to be achieved.

We can also mention the manufacture of stacked structures in which one of the films is provided with one different characteristic on the two faces. This is the case if the structure obtained by the direct process comprises a surface incompatible with the planned used after the separation step. For example, due to its polar nature, a monocrystalline SiC film has the characteristic that the surface of one face is composed mainly of silicon atoms on one face (called an Si type surface) and the surface of the other face is composed mainly of carbon atoms (C type surface). Continued growth in epitaxy on SiC assumes that a free Si type surface is available. However the transfer of an SiC film, for example using the direct process, is accompanied by a change in the nature of the surface due to turning over. The initial free surface is of the Si type since this type of face is easy to polish with SiC and is easy to bond by molecular bonding. Therefore, the free face is of the C type after transfer by the direct process. The same is true for a GaN layer.

DESCRIPTION OF THE INVENTION

This invention overcomes the disadvantages of prior art and provides a means of creating a stacked structure comprising either a film with some specific properties, or a film with a least one surface with specific properties.

The invention is based on the surprising fact observed by the inventors, that unlike the direct process for which the thin layer is bonded to the target substrate and then thinned, all the defects mentioned above can be avoided if the initial substrate is thinned before the thin layer is bonded to the target substrate. One or several intermediate supports need to be used to invert these bonding and thinning steps.

Therefore, the purpose of the invention is a process for manufacturing a stacked structure comprising at least one thin layer bonding to a target substrate, comprising the following steps:

a) formation of a thin layer starting from an initial substrate, the thin layer having a free face called the first contact face, b) putting the first contact face into bonding contact with a face of an intermediate support, the structure obtained being compatible with later thinning of the initial substrate, c) thinning of the said initial substrate to expose a free face of the thin layer called the second contact face and opposite the first contact face, d) putting a face of the target substrate into bonding contact with at least part of the second contact face, the structure obtained being compatible with later removal of all or some of the intermediate support, e) removal of at least part of the intermediate support in order to obtain the said stacked structure.

Thinning in step c) or removal in step e) can use any technique capable of eliminating the initial substrate or the intermediate support. In particular, separation, fracture (by the creation of an area weakened by the introduction of gaseous compounds), mechanical and/or chemical attack. It may be possible to reuse the substrate and the support, depending on the thinning and removal type.

According to one particular embodiment, the target substrate is only a temporary support for the thin layer, the said steps in the process being entirely or partly repeated, the target substrate being treated as the initial substrate or the intermediate support.

Thus, the process according to the invention can be used to transfer the thin layer from one support to another support as many times as necessary to obtain a stacked structure with the required characteristics, and particularly a stack with technological component levels.

The compatibility of the said structure in step b) and/or in step d) may be achieved by forming a thin layer in step a), in order to avoid bonding defects during thinning in step c) and removal in step e), respectively. This compatibility may be due to the finished thickness of the thin layer and/or the material or materials making up the said thin layer. The nature of the intermediate support and/or the target substrate in contact with the thin layer, may be chosen to avoid any incompatibility related to a phase change of the materials in the resulting structure. The nature of the intermediate support and/or the target substrate in contact with the thin layer, may be chosen so as to avoid any incompatibility related to heterogeneity of the materials in the resulting structure. The nature of the intermediate support and/or the target substrate in contact with the thin layer, may be chosen to avoid any incompatibility related to a difference between the coefficients of thermal expansion of the intermediate support and the thin layer. To enable this compatibility, the thin layer and/or the intermediate support and/or the target substrate may comprise at least one additional layer with contact face(s). In this case, before step d), the additional layer may be provided with all or part of at least one component. The additional layer may be composed of an oxide or polycrystalline silicon or amorphous silicon.

Steps a) and c) may be such that the roughnesses of the first contact face of the thin layer and/or the intermediate support are less than the roughnesses of the second contact face and/or the target substrate respectively, the compatibility of the structure of step d) being obtained by putting the second contact face of the thin layer into bonding contact and by removal of the intermediate support.

The bonding contact of the first contact face and/or the second contact face of the thin layer achieving the said compatibility in step b) and/or step d) may result from the use of a treatment enabling bonding contact. The treatment enabling bonding contact may be mechanical-chemical and/or ionic polishing, insertion of an intermediate layer between a corresponding contact face of the thin layer and the intermediate support or the target substrate, or a heat treatment or a chemical treatment, or any combination of these treatments may be applied. The treatment may be applied at high temperature due to compatibility of the structure.

Advantageously, step b) and/or step d) may be put into bonding contact by molecular bonding.

The surface polarity (related to the nature of the atoms on the surface) of the first contact face of the thin layer may be different from the surface polarity of the second contact face, the compatibility of the structure of step d) being obtained by putting the second contact face of the thin layer into bonding contact with the target substrate, and by removal of the intermediate support from the first contact face of the thin layer that thus becomes a free face. The structure compatibility achieved in step d) may be obtained by putting the second contact face of the thin layer into bonding contact with the target substrate with a bonding energy appropriate for possible removal of the target substrate after step e). Advantageously, this bonding energy is low. An intermediate step may be inserted between steps c) and d), consisting of making elements in the second contact face of the thin layer and/or in the target substrate, the structure obtained after step d) being compatible with the presence of the said elements. These elements may be cavities or all or part of components (microelectronics, optronics, etc.) and may be made with a certain surface topology. Before step d), an intermediate step may be provided consisting of a trimming operation in order to isolate at least one area of the second contact face, step d) putting at least one of these areas into bonding contact with the target substrate. The trimming operation may possibly take place before step a). After the removal step e), the area(s) of the layer that are not in bonding contact with the target substrate remain on the intermediate support and may be transferred later.

Step a) may be done starting from a substrate covered by at least one layer of material. In this case, after step e), the process may comprise a step consisting of eliminating the layer of material covering the substrate in step a).

According to one preferred embodiment:
step a) includes the introduction of gaseous compounds into the initial substrate through one of its faces corresponding to the first said contact face, to form a weakened layer separating the said film from the rest of the initial substrate and possibly leading to a fracture of the initial substrate during step c),
step c) consists of making a preferred treatment to obtain the fracture in the initial substrate at the weakened layer.

This treatment may be thermal and/or mechanical. The initial substrate may be single layer or multi layer. In particular, it may comprise an epitaxied layer. The same applies for the target substrate and for the intermediate support.

According to one preferred embodiment, at least part of the intermediate support may be removed by the introduction of gaseous compounds either through the thin layer after creating a contact, or through the contact face of the intermediate support before or after putting it into bonding contact with the first contact face of the thin layer, this addition of gaseous compounds forming a weakened layer enabling the removal of all or part of the intermediate support, possibly covered by a film of the thin layer, by fracture. In this case, the intermediate support may be reused, for example, as a new support.

Possibly, the stacked structure obtained at the end of step e) is thinned on the side of the first contact face.

The process may use a very good quality and therefore high cost initial substrate, for example a 300 mm diameter monocrystalline silicon, an intermediate support compatible with the initial substrate in the sense of step b), for example a monocrystalline silicon substrate covered by an $SiO_2$ oxide film, a target substrate made of polycrystalline of monocrystalline silicon of lower quality than the silicon in the initial substrate, for example the thin layer comprising silicon oxide on the monocrystalline silicon originating from the initial substrate. Similarly, the target substrate may be other than silicon. At the end of the process, the film obtained on the target substrate is then very good quality. Furthermore, the initial substrate may be made, and the intermediate support will be reusable or may be sacrificial depending on its quality or cost. Furthermore, an SiC or GaAs initial substrate, an SiC or GaAs intermediate support, or an SiC or GaAs target substrate of lower quality than the initial substrate material may be used, the thin layer containing SiC or GaAs originating from the initial substrate.

The thin layer may also be a layer of a material from Si, GaN, SiC, $LiNbO_3$, Ge, GaAS, InP, sapphire and semiconductors.

The invention provides many advantages including the following:
- A monocrystalline film with good crystalline quality can be transferred, while the stop layer for thinning the intermediate support is an amorphous layer.
- A recyclable intermediate support may be used, for example by checking its bonding energy, if the cost of the intermediate substrate (quality, nature, etc.) is high. Thus, a polycrystalline SiC intermediate support may be used to transfer a high cost and/or high quality monocrystalline SiC film. As an example, the bonding energy may be controlled by checking the roughness of an additional layer of $SiO_2$ deposited on the thin layer or on the intermediate support. As an alternative to control the bonding energy of the intermediate support, it would also be possible to use a consumable film (for example an oxide) on the surface of this intermediate support to recycle it (lift-off technique).
- It is easy to choose the thickness of the final buried oxide or the intermediate layer (dielectric, metallic, etc.).
- The principle of the invention may be applied to layers made of other monocrystalline materials made of something other than silicon at least for one of the films in the stacked structure. In particular, the process may be used to apply a sapphire, SiC, GaN, $LiNbO_3$, Ge, GaAs, InP film onto any support.
- This same principle may be applied to target substrate types other than silicon, for example quartz or any substrate, and advantageously a low cost substrate (glass, plastic, ceramic, etc.).
- This process may be applied to any type of semiconducting film, for example to III-V, II-VI and IV semiconductors or to a diamond or nitride film or any other type of film, for example oxides such as $Al_2O_3$, $ZrO_2$, $SrTiO_3$, $LaAlO_3$, MgO, $Yba_xCu_yO_z$, $SiO_xN_y$, $RuO_2$ or other materials, and particularly piezoelectric, superconducting, insulating, metallic, pyroelectric, monocrystalline and other materials.
- This process may be applied to materials with surfaces with polar characteristics.
- This process may be applied repetitively to materials, for example to obtain complex multi-layer structures.
- The manufacturing principle for a monocrystalline film alone, for example silicon on a final support, may advantageously be used in an application in which the final support is a structure with at least one processed or unprocessed layer. This monocrystalline film of transferred silicon then itself becomes the subject of technological steps in order to create a component. This principle, if it is repeated, can be used for 3D stacking of technological levels of components.
- The process according to the invention can compensate for several types of incompatibilities in a particular production. One or several intermediate supports may have to be used to achieve this.
- Initial substrates, target substrates and intermediate supports may be stacked structures.

BRIEF DESCRIPTION OF THE DRAWINGS

The invention will be better understood and other advantages and special features will become clear after reading the following description, given as a non-limitative example, accompanied by the attached drawings among which.

DETAILED DESCRIPTION OF EMBODIMENTS OF THE INVENTION

Several examples of the use of this invention will be described. These examples are variations on a process for embodiment of the invention, consequently we will start by briefly describing this process using an example and with reference to FIGS. 1 to 6.

Figure 1:
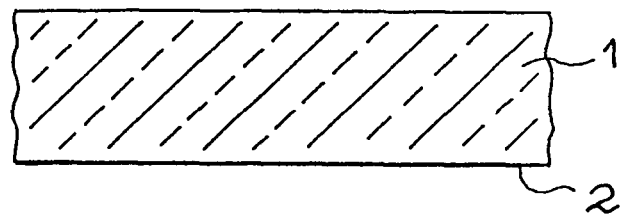
FIG. 1 shows a cross-sectional view of a substrate called the initial substrate to which this invention is applied.

FIG. 1 shows a cross-sectional view through a 725 μm thick 200 mm diameter silicon wafer 1 forming the initial substrate. Face 2 of the initial substrate 1 is oxidized to a thickness of 400 nm by heat treatment to create an oxide layer 3 (see FIG. 2). A multi-layer can also be used on substrate 1.

Figure 2:
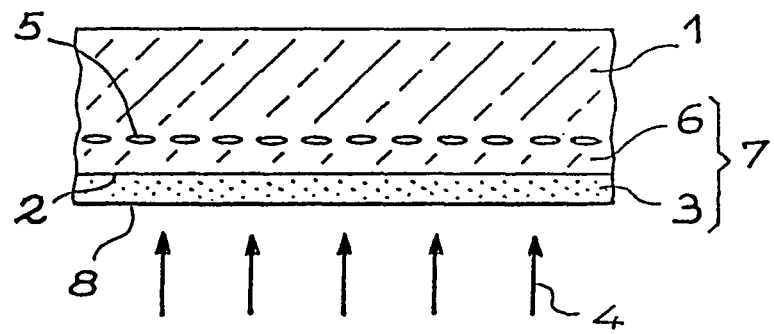
FIG. 2 shows a cross-sectional view of the initial substrate covered by a material layer and to which an ionic implantation step is applied during implementation of the process according to the invention.

The next step is an ionic implantation of the initial substrate 1 by gaseous compounds 4 passing through its face 2, and therefore also passing through the oxide layer 3 as shown in FIG. 2. For example, the gaseous compounds 4 may be hydrogen ions implanted at an energy of 75 keV and at a dose of about $6 \times 10^{16}$ atoms/cm$^2$. This thus induces a weakened layer 5 in the plane parallel to face 2.

The part of the substrate 1 between the face 2 and the weakened layer 5 forms a film 6. The assembly formed by stacking the film 6 and the oxide layer 3 forms a thin layer 7. The thin layer 7 has a free face 8 called the first contact face.

Figure 3:
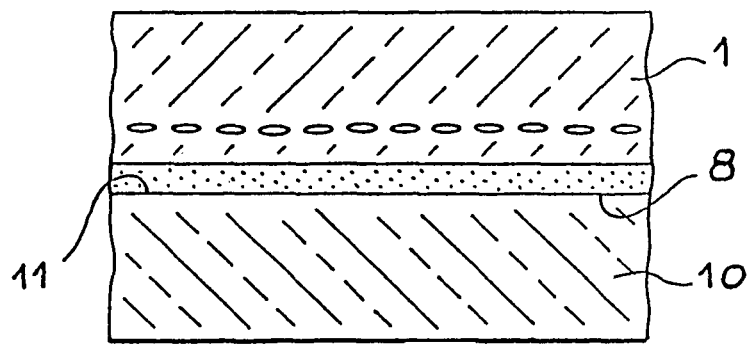
FIG. 3 illustrates the step in which the initial substrate is put into bonding contact through the material the material layer with an intermediate support according to this invention.

The first contact face 8 is cleaned to make it suitable for molecular bond, for example by a preparation intended to make it sufficiently hydrophile, and it is put into contact by molecular bonding with a face 11 of another silicon wafer 10 called the intermediate support as shown in FIG. 3. In one alternative application, a layer (adhesive, meltable layer, etc.) that can cause bonding with the intermediate support may be applied to bond to the said support.

Figure 4:
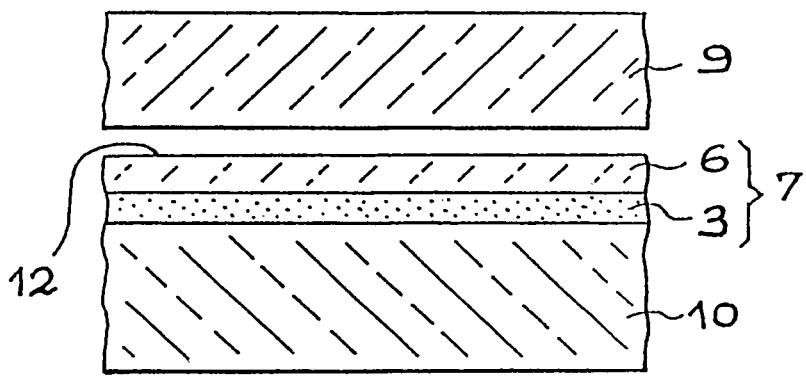
FIG. 4 illustrates the step in which at least part of the initial substrate is eliminated according to this invention.
Figure 5:
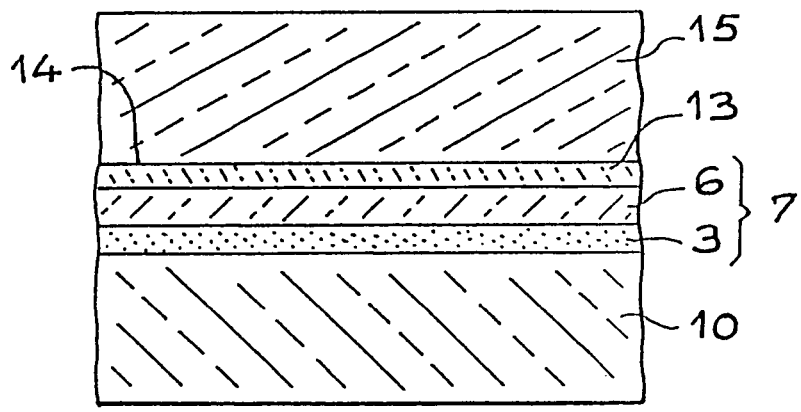
FIG. 5 illustrates the step of creating a bonding contact with a face of a target substrate, through a possible layer according to this invention.
Figure 6:
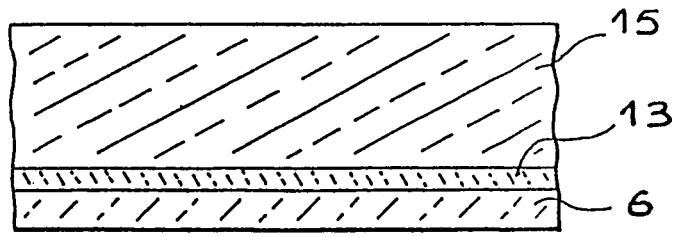
FIG. 6 shows the stacked structure obtained by the process according to the invention.

The assembly consisting of the initial substrate 1 and the intermediate support 10 is subjected to a separation treatment, for example a heat treatment, in order to separate the film 6 by fracture from the remainder 9 of the initial substrate 1 (see FIG. 4). The film 6 remains attached to the intermediate support 10 and has a free face 12.

Advantageously, the thin layer 7 is bonded onto the intermediate support 10 and is reinforced by a high temperature heat treatment. Depending on the temperature, the molecular bonding energy between these two parts may for example be of the order of 1.5 J/m$^2$.

The free face 12 of film 6 is then smoothed by a surface treatment, for example by mechanical-chemical polishing, or annealing possibly under a partial or total hydrogen atmosphere, bombardment by isolated or concentrated ions or chemical attack in order to remove all or part of the film 6, thus freeing a face of the layer 3 if the layer 3 is sufficiently selective with respect to the intermediate substrate. It may be covered by a film 13 that may be multi-layer, and the free face of which forms the second contact face 14 (see FIG. 5). The film 13 may be obtained by deposition, by heat treatment, by chemical treatment, etc.

After the second contact face 14 has been cleaned, it is put into bonding contact with a target substrate 15. The bond may be reinforced by a high temperature heat treatment.

The intermediate support 10 is then removed, for example by grinding together with a chemical attack. The oxide layer 3 may also be removed to obtain the stacked structure shown in FIG. 6 and composed of the target substrate 15, the film 13 and the film 6.

According to a first alternative embodiment, the film 13 may be a 20 nm thick oxide layer produced thermally on the surface 12 of the film 6. The target substrate 15 may be made of silicon and oxidized on the surface (for example over 20 nm) or not. In this case, the bond of film 13 on the target substrate 15 may be reinforced by a treatment at 1100° C. or a molecular type bond. As before, bonding is possible using an adhesive or meltable material or any other type of material. This would then give a high quality stacked structure while avoiding the appearance of bubbles at the bonding interface. The intermediate support 10 is removed by grinding followed by a chemical attack in a tetramethylammonium hydroxide (TMAH) or potash solution, the oxide layer 3 then acting as a chemical etching stop layer for the silicon. This oxide layer 3 is eliminated using a hydrochloric acid based solution. The final thickness of film 6 is adapted by thinning, for example using sacrificial oxidation. A final thickness of 50 nm may be obtained with a very good uniformity.

According to a second alternative embodiment, the oxide layer 3 formed on the initial substrate 1 is 400 nm thick. Hydrogen atoms are implanted under the same conditions as before. After separation of the silicon film 6 from the rest 9 of the initial substrate 1, the film 6 is thinned, by example by sacrificial oxidation to 30 nm, and is covered by a 50 nm thick oxide 13. The second contact face 14 is bonded to the target substrate 15. Treatments requiring a high temperature can then be applied without creating a risk of bubbles appearing at the bonding interface.

A third alternative embodiment can give a low energy bonding interface on the target substrate. In order to achieve this, the surface 12 of film 6 revealed by separation of the film 6 from the rest 9 of the initial substrate (see FIG. 4) is smoothed, for example by mechanical-chemical polishing. This thermally forms an oxide film 13 (see FIG. 5) with a thickness of 1000 nm. The free surface of film 13 is then roughened with an average RMS value equal to 0.6 nm, for example by etching using a 10% hydrofluoric acid solution for 12 minutes. After cleaning, the second contact face 14 is bonded to the target substrate 15. This target substrate is a silicon substrate that may have been oxidized on the surface, for example to a depth of 1000 nm. Its surface may have been roughened to an average RMS value of 0.6 nm using the same chemical treatment as was used for the film 13. The bonding energy is adaptable as a function of the induced roughness and a heat treatment, if any. At this stage, it is possible for the bonding energy to be lower than the energy necessary for satisfactory execution of the direct process, called the threshold bonding energy.

The silicon intermediate support 10 is then removed, for example by grinding together with chemical attack in a solution of TMAH or potash, the oxide layer 3 acting as an etching stop layer. This oxide layer 3 is eliminated by etching using a hydrofluoric acid solution and the final thickness of film 6 is adapted by thinning, for example by sacrificial oxidation.

This alternative embodiment is capable of producing a final film 6 with an approximate thickness of 200 nm and with very good uniformity. The bonding energy with the target substrate 15 is low, so that the film can be recovered at the end of the process by separation from the target substrate 15. Advantageously, before the film is recovered, it is possible to make all or part of a component, for example for microelectronic, optoelectronic, photovoltaic applications or for sensors, etc. Advantageously, according to another application, this type of stacked structure with low bonding energy can be used to make film depositions or transfers. Another application of this alternative is related to high cost substrates.

According to another alternative, an attempt will be made to reuse the initial and intermediate substrates. According to this alternative, the initial wafer may be made of high quality and/or high cost monocrystalline silicon, for example a 300 mm diameter wafer. The target support may be made of lower quality monocrystalline silicon, or low cost polycrystalline silicon. The obstacles overcome using this process include bonding defects or the appearance of observable bubbles in the direct process. In step d) in the first example, the free face of the thin layer may be bonded directly to the target substrate, for example in the case in which the application requires conducting bonding. In a second example, in step d), the free face of the thin layer or the target substrate may be covered by an oxide film, for example to enable bonding on the low cost target substrate. In this final example, the oxide makes it possible to smooth the surface to be bonded and the target substrate will be made of polycrystalline silicon.

In this alternative to the process, the intermediate silicon substrate may be low cost, for example polycrystalline. An additional layer, for example made of $SiO_2$ for surface smoothing, will advantageously be deposited on the intermediate substrate.

Also in this alternative, the intermediate substrate may be made of high quality silicon. It will then be advantageous to recover it, for example using a lift-off technique or by implantation of gaseous compounds followed by separation, or for example by a technique after step b) based on a fairly low bonding energy to enable separation, for example by mechanical or pneumatic methods, etc.

In all cases of this alternative, the initial high quality and/or high cost substrate, for example 300 mm diameter silicon, will advantageously be recovered, for example using gaseous compound implantation in step a) and separation from the rest of the initial substrate in step c).

A fourth alternative embodiment can provide a low energy bonding interface on the target substrate so that the film can be released and the target substrate can be recovered. This alternative embodiment, which has many points in common with the previous alternative, makes it possible to apply a number of treatments to the film fixed to the target substrate, for example technological steps for making electronic components including high temperature heat treatments. These heat treatments would make it almost impossible to separate a film from a substrate produced using the direct process.

We have already seen that it is possible to achieve a low energy bond of the film on the target substrate, for example an energy of 0.5 J/m$^2$. This type of bonding energy can be achieved despite heat treatment at a temperature exceeding 900° C., by maintaining control over the roughness of surfaces before making contact to ensure that RMS values are greater than 0.6 nm. These energies are then compatible so that the "processed" film can be released by separation of the target substrate after application of the technological steps to make components. It is then possible to recover the target substrate, which may be an advantage considering its cost.

Consider the 300 mm diameter silicon substrate as an example of a high cost target substrate. Only the film part of the substrate can be reused for the components and it may be important to recover the initial substrate and/or the intermediate support and/or the target substrate.

A fifth alternative embodiment is applicable in the case in which the free surface of film 6 delimited in the initial substrate is such that the direct bond on a target substrate is very weak, for example due to roughnesses over at least one of the two surfaces to be put into contact. The bonding energy on the target substrate is then insufficient to enable separation of the film using the direct process.

This problem is solved by preparing the first contact face 8 to make it suitable for bonding, for example by the deposition of a sacrificial film, after the ionic implantation step, and by an additional smoothing or planarization step. According to the invention, an intermediate support is used, for example a silicon substrate possibly covered by an oxide layer (for example 100 nm thick) and with a slightly roughened contact surface (for example with an average RMS value equal to 0.2 nm). The fact that bonding is applied on a surface with a low roughness value results in a sufficiently high bonding energy so that the step in which the film 6 is separated from the initial substrate is possible later.

Once the separation has been achieved, a high temperature heat treatment may be applied, for example to reinforce the bond or as a function of operations necessary for the target applications (diffusion of implanted element, oxide film deposited later, etc.) A surface treatment, for example mechanical-chemical polishing, smoothes all or part of the revealed surface of the film separated from its initial substrate.

After cleaning, the free surface of the film 6 or the additional film 13, called the second contact face 14 is bonded onto the silicon target substrate that for example is covered by an approximately 1000 nm thick oxide layer, the surface of which is made rough by chemical treatment. Bonding may be varied by a heat treatment, but it remains low. At this stage, the bonding energy between the film 6 or the film 13 and the target substrate 15 (or possibly its surface layer) is lower than the energy necessary for smooth execution of the step in which the film is separated from the rest of the initial substrate. The intermediate support 10 is then removed, for example by grinding and chemical attack and the oxide layer 3 is eliminated by chemical attack. The final thickness of the film 6 is modified by thinning, for example by sacrificial oxidation. This thickness may be 50 nm with very good uniformity.

Advantageously, this fifth alternative will be used when the initial surface roughness of faces 2 or 8 corresponds to a topology etched on the initial substrate or on the initial thin layer or on the target substrate. An oxide film 13 (see FIG. 5) with a thickness of 1000 nm may be made, for example thermally on the surface of film 6. The surface topology, that does not initially enable the direct process, may be reproduced at this step, for example by a chemical etching treatment. One application example is the case of ducts placed at the bonding interface with the target substrate and capable of inducing cooling of the structure by circulation of a fluid. Another example in another field is the production of a texture at the bonding interface of the target substrate for photovoltaic applications. Furthermore, this topology may be made exclusively or partially in the target substrate, and may or may not be covered by additional layers.

A sixth alternative embodiment differs from the previous alternative in that the intermediate support can be recovered. This solution is attractive since the intermediate support is an element with a certain quality to enable separation of films and its cost can then be high. For example, the process according to the invention may advantageously keep the bonding energy of the initial substrate onto the intermediate support equal to a value just higher than the threshold energy necessary to separate the film from the initial substrate. The bonding energy of the initial substrate and the intermediate support may be controlled by checking the surface roughnesses and heat treatments used, if any, in addition to the separation treatment. Considering that the intermediate support can be recycled, it is possible to use expensive substrates as supports (compatible with the application), or even substrates that are specially prepared to facilitate separation at the first bonding interface. The intermediate support may be recovered after bonding to the target substrate using a "lift-off" technique, or by mechanical and/or pneumatic separation, or by using a process in combination with a gaseous implantation, these techniques possibly being combined with each other.

A seventh alternative embodiment is applicable particularly on the case in which the free surface of the film separated from the initial substrate is difficult to polish or if its smoothing quality is not sufficient after a direct process.

The surface roughness of films obtained by the direct process frequently has to be reduced depending on the planned application, after the separation step. Conventionally, a mechanical-chemical polishing is possible. However for many materials for example "hard" materials (sapphire, SiC, diamond, etc.), this polishing is either not really appropriate (not effective for polishing a film of hard material since it was developed for the same material in massive form, or because the quality is insufficient, or if there is a thickness uniformity defect), or it takes too long (which increases the manufacturing cost). The invention solves this problem.

Consider the example of an initial substrate 1 formed by a wafer of monocrystalline sapphire with orientation [1-102] and polished on the surface with an epitaxial quality. The wafer may be covered again with a layer of silicon oxide. The initial substrate 1 is implanted by gaseous compounds, for example hydrogen. If there is no oxide layer, the implantation energy may be 60 keV for a dose of $2\times10^{17}$ atoms/cm$^2$. In the presence of an oxide layer, the implantation energy is increased to take account of the thickness of this oxide layer. After preparation of the implanted face (first contact face), the initial substrate is put into contact by molecular bonding with the intermediate support. The sapphire film is separated in or close to the weakened layer.

After this separation, it is desired to obtain a sapphire film with low micro-roughness. Mechanical-chemical polishing is very long to apply for this type of material, and the quality and uniformity of polishing a thin film is difficult to control. The direct process cannot be applied since the surface quality is not of the epitaxial type or the implied extra cost is high. The sapphire initial substrate is sold by the wafer supplier with a face that is already of epitaxial quality, consequently the invention can be used to obtain a stacked structure comprising a film for which the free face (or front face) is this initial face with epitaxial quality.

Therefore, the separation step between the film and the rest of the initial substrate is made after putting the initial substrate into bonding contact on the intermediate support through an additional initial film. After separation, the free face of the sapphire film has a certain roughness. A layer of material, for example a layer of $SiO_2$ is deposited on the free face and mechanical-chemical polishing enables planarization of its surface. After preparation of this surface and the corresponding surface of the target substrate (for example made of silicon), the second step of creating a bonding contact is achieved. Removal of the intermediate support reveals the initial front face of the sapphire film or the additional initial film. This additional initial film may advantageously be a silicon oxide film. In this case, it may be removed by chemical attack to release the initial front face of the sapphire film. If this front face is covered by an oxide layer, this layer may be removed by chemical attack.

An eighth alternative embodiment is applicable to the case in which the film is provided with faces with different characteristics. This is the case mentioned in the state of prior art for continued growth in epitaxy on the film 6, for example made of SiC (material with an Si type face and C type face) or a GaN film.

For example, an initial SiC substrate is covered by an oxide layer about 400 nm thick. The initial substrate is implanted through the oxide layer by hydrogen atoms with an energy of 120 keV and at a dose of $8\times10^{16}$ atoms/cm$^2$. The implanted surface is then made hydrophile and is put into contact for molecular bonding with one face of an intermediate support, for example covered by a 1 μm thick oxide layer. A separation treatment separates the film from the rest of the initial substrate. The SiC film then bonds to the intermediate support through the oxide layer. A surface treatment (for example mechanical-chemical polishing or deposition of a film enabling planarization) makes the new free surface of the SIC film suitable for subsequent bonding. This free surface is made hydrophile and is put into contact for molecular bonding with a corresponding face of the target substrate. After a high temperature heat treatment intended to reinforce bonding, the value of molecular bonding energy can be equal to or greater than 1 J/m$^2$.

The intermediate support 10 is then removed, for example by grinding followed by chemical attack, the oxide layer 3 acting as an etching stop layer. Finally, the oxide layer 3 is removed by attack using a solution based on hydrofluoric acid. The final thickness of the film is adapted, for example using a thinning heat treatment.

In this alternative embodiment, a final thickness of the film 6 equal to 100 nm is obtained with very good uniformity over a large part of the structure. The released surface of the film corresponds to the surface suitable for continued growth in epitaxy.

A ninth alternative embodiment is applicable to the case in which it is desired to recover the intermediate support and in which the film (or one of the films) has faces with different characteristics. This alternative is a special case of the previous alternative.

After the step that consists of separating the film 6 from the rest 9 of the initial substrate (see FIG. 4), an ionic implantation step is carried out through the surface 12 to induce a weakened area in the intermediate substrate or in one of the additional layers deposited on the intermediate substrate or the thin layer 7 depending on their nature. It may be a hydrogen implantation in the intermediate substrate with an energy of 140 keV and at a dose of $8\times10^{16}$ atoms/cm$^2$ for the example of the materials mentioned in the eighth alternative and in which the intermediate substrate is made of SiC.

The target substrate is put into bonding contact with the second contact face. The intermediate support is then separated from the stacked structure and may be recycled. Recovery of the intermediate SiC support is economically very attractive in the case of a process for production of an SiC film on a silicon target substrate. The oxide layer 3 is removed by etching using a hydrofluoric acid solution. The final film thickness 6 is adapted by thinning, for example by sacrificial oxidation.

A tenth alternative embodiment applies to the case in which the film and the target substrate have at least one characteristic that makes the direct process incompatible. For example, it may be the case in which the difference between the coefficients of thermal expansion of the materials from which the film and the target substrate are formed is too great. For example, silicon and quartz, silicon and sapphire, silicon and gallium arsenide, Si and InP, Si and LiNbO$_3$. A heat treatment used before or during the separation step by the direct process causes either separation at the contact interface or failure of one of the two elements put into bonding contact.

For example, the starting point can be an initial substrate 1 composed of a silicon wafer covered by a 400 nm thick oxide layer 3. A weakened layer 5 is created by hydrogen implantation at an energy of 75 keV and with a dose of $6\times10^{16}$ atoms/cm$^2$. The contact face 8 is bonded to an intermediate support 10 with a compatible coefficient of thermal expansion. This intermediate support may be another silicon wafer covered by a 200 nm thick oxide layer. Heat treatments can then be applied. These heat treatments enable an increase in the bonding energy, which will cause a high quality separation between the film and the rest of the initial substrate. Once the separation has been made, the stack shown in FIG. 4 can be obtained. A surface treatment minimizes the surface micro-roughness of film 6. After surface preparation, if necessary, the stack is bonded onto a target substrate, for which the coefficient of expansion may be very different from the coefficient of expansion of the initial substrate, for example a quartz or sapphire platelet and the intermediate support is removed, for example by grinding, chemical etching, lift-off, etc.

Another example of this tenth alternative consists of causing bonding in step b) in which the energy corresponds at least to the threshold energy below which step c) cannot occur. Before step d), an ionic implantation, for example of hydrogen, is made in the intermediate substrate or in one of the additional layers in this intermediate substrate through face 12. This implantation will induce a weakened layer in this substrate, in which the separation will take place during step e). The intermediate substrate can then be recovered and reused.

Similar examples may be obtained with initial substrates themselves composed of a stacked structure, for example a silicon wafer covered by a nitride layer although the target substrate may be a silicon wafer covered by a thick layer of thermal oxide. The coefficient of thermal expansion of the nitride film may be greater than $4\times10^{-6}/k$, while the coefficient of thermal expansion of the oxide film is less than $10^{-6}/k$. A high temperature heat treatment used during or after the direct process, for example to thin the silicon film by sacrificial oxidation, is not compatible for some bonding energy conditions between the nitride and silica films. In this case, the process according to the invention solves the problem. After step c), the thin layer is treated at high temperature to thin the silicon by sacrificial oxidation. After step d), an additional nitride layer ($Si_3N_4$) is made on the free face of the thin layer and the target substrate is covered by an oxide film ($SiO_2$). The two layers can also be deposited on the free face of the thin layer or on the target substrate. The final stacked structure corresponds to the thinned layer of silicon supported by the two films with very different coefficients of expansion.

According to an eleventh alternative, the characteristic that makes the direct process incompatible may be a phase change occurring in a film. For example, a palladium film put into contact with a silicon substrate enables bonding by forming a silicide due to a heat treatment at a temperature above 200° C. However, at 900° C., this silicide degrades, for example making it impossible to perform a sacrificial oxidation step at 900° C. in the direct process. The invention solves this problem.

After making a thin layer 7 comprising a silicon film 6 on an intermediate support 10, the silicon film is thinned at 900° C. by sacrificial oxidation, and the palladium film is then deposited after the step to smooth the free face 12, and forms all or part of the film reference 13. The heat treatment to form a bond with the target substrate is then made at a temperature below 870° C., and the bond will be good quality and the silicon film will be the right thickness.

The invention claimed is:

1. A process for manufacturing a stacked structure comprising at least one thin layer bonded to a target substrate, comprising the following steps:
    a) implantation of gaseous compounds into an initial substrate through one of its faces corresponding to a first contact face, to form a weakened layer, a thin film being defined between said first contact face and said weakened layer;
    b) bonding the first contact face of the thin film to an intermediate support by molecular bonding;
    c) fracturing at the weakened layer to expose a second contact face of the thin layer opposite the first contact face, wherein said fracturing comprises applying a thermal treatment to the structure obtained at the end of step b)
    d) bonding a face of a target substrate with at least part of the second contact face by molecular bonding; and
    e) removing at least part of the intermediate support in order to obtain the said stacked structure by mechanical and/or chemical attack.

2. The process of claim 1, wherein the target substrate is a semiconductor substrate.

3. The process of claim 1, wherein an intermediate step is carried out between step c) and step d), consisting of making elements in the second contact face of the thin layer and/or the target substrate, the structure obtained after step d) being compatible with the presence of said elements.

4. The process of claim 1, wherein an intermediate step is performed before step d), consisting of a trimming operation in order to isolate at least one area of the second contact face, and putting at least one of these areas into bonding contact with the target substrate.

5. The process of claim 1, wherein step a) is done starting from an initial substrate covered by at least one layer of material.

6. The process of claim 5, wherein after step e), the process comprises a step consisting of eliminating the layer of material covering the initial substrate in step a).

7. The process of claim 5, wherein the initial substrate is made of silicon, and the layer of material that covers it is made of silicon oxide.

8. The process of claim 1, wherein the stacked structure obtained at the end of step e) is thinned on the side of the first contact face.

9. The process of claim 1, wherein there is used an initial substrate made of monocrystalline silicon, an intermediate support made of monocrystalline silicon, a target substrate made of polycrystalline or monocrystalline silicon of lower quality than the silicon in the initial substrate.

10. The process of claim 1, wherein after step c) and before step d), a layer of amorphous material is formed on the second contact face.

11. The process of claim 1, wherein after step c) and before step d), it is provided a bonding interface, between the second contact face and a corresponding contact face of the target substrate, having a bonding energy adapted to allow a later debonding at said bonding interface.

12. The process of claim 1, wherein during step b), the thin layer of the initial substrate and the intermediate support have compatible coefficients of thermal expansion to allow application of a heat treatment increasing the bonding energy of the thin layer and the intermediate support.

13. The process of claim 1, wherein after step c) and before step d), a heat treatment is applied to the thin layer, then the free face of the thin layer is covered with a layer of a material allowing the bonding contact of step d).

14. The process of claim 1, wherein after step c) and before step d), a layer of a polishable material is formed on the free face of the thin layer obtained in step c), this layer of a polishable material being polished to allow a surface planarization.

15. The process of claim 1, wherein the structure achieved in step d) is compatible with later removal of at least part of the intermediate support by creating a bonding contact of the second contact face of the thin layer with the target substrate with a bonding energy that enables removal of the target substrate after step e).

* * * * *